(12) United States Patent
Cai (10) Patent No.: US 9,105,079 B2
(45) Date of Patent: Aug. 11, 2015

(54) METHOD AND SYSTEM FOR OBTAINING OPTICAL PROXIMITY CORRECTION MODEL CALIBRATION DATA

(71) Applicant: SEMICONDUCTOR MANUFACTURING INTERNATIONAL (SHANGHAI) CORPORATION, Shanghai (CN)

(72) Inventor: BoXiu Cai, Shanghai (CN)

(73) Assignee: SEMICONDUCTOR MANUFACTURING INTERNATIONAL (SHANGHAI) CORPORATION (CN)

( * ) Notice: Subject to any disclaimer, the term of this patent is extended or adjusted under 35 U.S.C. 154(b) by 0 days.

(21) Appl. No.: 14/283,581

(22) Filed: May 21, 2014

(65) Prior Publication Data

US 2015/0058814 A1    Feb. 26, 2015

(30) Foreign Application Priority Data

Aug. 22, 2013  (CN) .......................... 2013 1 0371044

(51) Int. Cl.
```
G06F 17/50     (2006.01)
G06T 7/00      (2006.01)
H01J 37/22     (2006.01)
H01J 37/28     (2006.01)
```
(52) U.S. Cl.
CPC ............ *G06T 7/001* (2013.01); *G06F 17/5081* (2013.01); *H01J 37/222* (2013.01); *H01J 37/28* (2013.01); *G06T 2207/30148* (2013.01); *H01J 2237/226* (2013.01); *H01J 2237/2817* (2013.01)

(58) Field of Classification Search
USPC .......................................................... 716/53
See application file for complete search history.

(56) References Cited

U.S. PATENT DOCUMENTS

| | | | |
|---|---|---|---|
| 7,418,693 B1 * | 8/2008 | Gennari et al. | 716/55 |
| 7,941,768 B1 * | 5/2011 | Wei | 716/54 |
| 2006/0266243 A1 * | 11/2006 | Percin et al. | 101/484 |
| 2008/0077907 A1 * | 3/2008 | Kulkarni | 716/20 |
| 2009/0199137 A1 * | 8/2009 | Huckabay et al. | 716/4 |
| 2009/0300573 A1 * | 12/2009 | Cao et al. | 716/19 |
| 2011/0181688 A1 * | 7/2011 | Miyamoto et al. | 348/36 |
| 2014/0123083 A1 * | 5/2014 | Casati et al. | 716/53 |
| 2014/0359542 A1 * | 12/2014 | Fujimura et al. | 716/53 |

* cited by examiner

*Primary Examiner* — Suresh Memula
(74) *Attorney, Agent, or Firm* — Innovation Counsel LLP (57) ABSTRACT

A method may be implemented for obtaining calibration data for use in calibrating an optical proximity correction model. The method may include capturing an image for each portion of a plurality of portions of a wafer to obtain captured images. The method may further include assembling at least portions of the captured images to form an assembled image. The method may further include mapping layout data of the wafer with the assembled image. The method may further include selecting portions of the assembled image based on the layout data of the wafer. The method may further include obtaining data associated with the portions of the assembled image as the calibration data.

20 Claims, 6 Drawing Sheets

Image of block 1    Image of block 2

Brightness curve

Differential curve

501

Brightness/ brightness change

METHOD AND SYSTEM FOR OBTAINING OPTICAL PROXIMITY CORRECTION MODEL CALIBRATION DATA

CROSS-REFERENCE TO RELATED APPLICATION

This application claims priority to and benefit of Chinese Patent Application No. 201310371044.0, filed on 22 Aug. 2013, the Chinese Patent Application being incorporated herein by reference in its entirety.

FIELD OF THE INVENTION

The present invention relates to a method and system of calibration data collection for optical proximity correction (OPC) model.

DESCRIPTION OF THE RELATED ART

Model-based optical proximity correction (OPC) may be used in lithographic processes. Model-based OPC may involve pattern correction using a mathematic model derived from fabrication information. A large amount of training data is typically required to train an OPC model to make the OPC model applicable to wafers. An applicable model template may be selected and used to correct sizes and/or shape of wafer patterns until the modelled shapes of the corrected wafer patterns meet the requirements of design specifications.

In order to ensure that an OPC model is applicable, a designer typically needs to collect calibration data from wafers. In conventional calibration data collection, a designer may first correct a wafer design using an OPC model to obtain a wafer that substantially satisfies design specifications. The designer may then scan interested areas of the obtained wafer to obtain images of the interested areas as calibration data. In the collection process, since there are a large amount of chips integrated on the same wafer, in order to obtain the images of a certain or some blocks in one or several chips, a remarkable spot (i.e., a position visible even in less magnification) on the wafer has to be positioned. Subsequently, interested areas may be positioned based on the remarkable spot, and image shots of the positioned areas may be taken.

Figure 1:
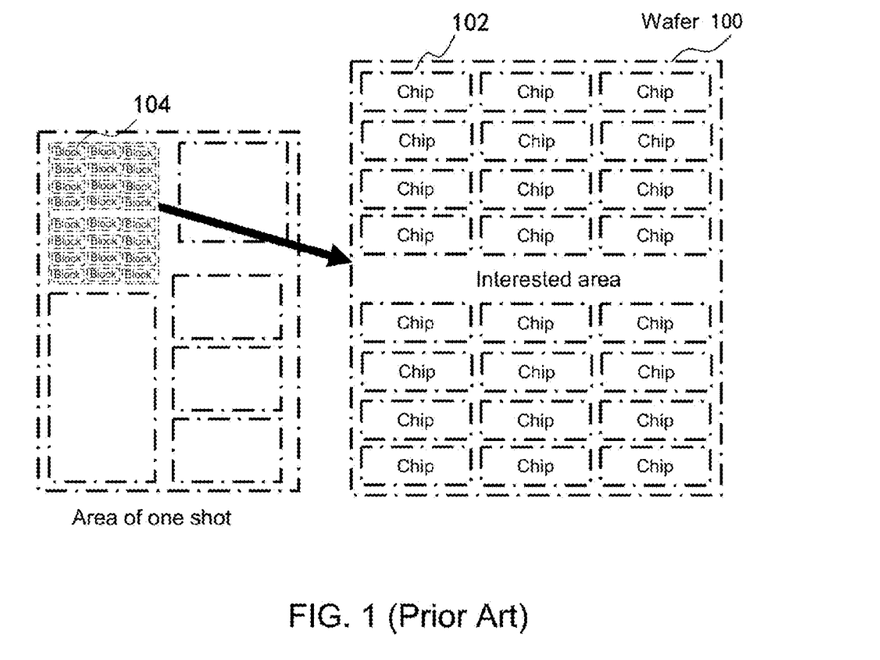
FIG. 1 is a diagram illustrating a process of collecting calibration data for use in calibrating an OPC model.

FIG. 1 illustrates a process of collecting calibration data for calibrating an OPC model. A wafer 100 illustrated on the right side of FIG. 1 comprises a plurality of chips 102, each including a plurality of blocks. An enlarged view of an interested area of the wafer 100 is illustrated on the left side of FIG. 1. For example, in order to obtain calibration data of an interested area, the following process may be required:

1. taking 5000 shots at 20000× to position a remarkable spot;
2. positioning the interested area based on the remarkable spot; and
3. taking, for example, 10000 shots at 100000×, 10000 shots at 150000×, and 20000 shoots at 200000.

This process of collecting calibration data may be sufficiently effective for wafers having a low density of integration. Nevertheless, for wafers with high density of integration degrees, the requirement of manual position intervention of this collection process may cause undesirably low repeatability and undesirably high position dependency.

Due to potential pattern recognition errors, data precision and reusability may be low. For ensuring that an OPC model is applicable, the process may require a lot of activities and supervision, such that much time and human resource may be required.

SUMMARY OF THE INVENTION

An embodiment of this invention may be related to a method for obtaining calibration data for use in calibrating an optical proximity correction model. The method may include capturing an image for each portion of a plurality of portions of a wafer to obtain captured images, the captured images including a first image and a second image, the first image including an image of a first portion of the wafer, the second image including an image of a second portion of the wafer, the first portion of the wafer immediately neighboring the second portion of the wafer. The method may further include assembling at least portions of the captured images to form an assembled image. The method may further include mapping layout data of the wafer with the assembled image. The method may further include selecting portions of the assembled image based on the layout data of the wafer. The method may further include obtaining data associated with the portions of the assembled image as the calibration data. At least one of the first portion of the wafer and the second portion of the wafer may represent, for example, one or more of a block illustrated in FIG. 1, a portion of the block, a portion of the block plus a portion of another block, etc.

The method may include controlling an image-capturing device to move in at least a first direction for obtaining the captured images. A portion of the second image includes a partial image of the first portion of the wafer. A width of the portion of the second image in the first direction may be substantially equal to a predetermined overlap margin.

The method may include the following steps: controlling an image-capturing device to move linearly to obtaining images for portions of a first chip on the wafer, the portions of the first chip being arranged in an array; determining a second chip on the wafer; and controlling the image-capturing device to move linearly to obtaining images for portions of the second chip.

The method may include the following steps: capturing an image for a corner portion of the first chip located at a corner of the first chip; determining a first portion of the second chip, the first portion of the second chip being located closer to the corner portion of the first chip than other portions of the second chip; and capturing an image for the first portion of the second chip before capturing images for the other portions of the second chip.

The method may include the following step: after obtaining the first image, controlling an image-capturing device to move in a first direction for obtaining the second image. The step of assembling may include the following steps: determining a first position error and a second position error associated with relative positions of the first image and the second image, the first position error being in the first direction, the second position error being in a second direction, the second direction being perpendicular to the first direction; and using adjustments implemented based on the first position error and the second position error, joining the image of the first portion of the wafer with the image of the second portion of the wafer.

The step of determining the second position error may include the following steps: determining a first position associated with a centroid of the image of the first portion of the wafer in the second direction; determining a second position associated with a centroid of the second image of the second portion of the wafer in the second direction; determining a position difference value associated with a difference between the first position and the second position in the second direction; and determining the second position error using the position difference value. The second position error may be determined using the position difference value and a predetermined allowance.

The step of determining the first position error may include the following steps: determining a splicing area that has a predetermined width in the first direction and includes at least one of a portion of the first image and a portion of the second image; providing stepwise relative movement between the image of the first portion of the wafer and the image of the second portion of the wafer in a movement direction aligned with the first direction according to a predetermined step size to increase image overlap in a stepwise manner (wherein a portion of one of the first image and the second image may have been removed); measuring brightness change values of the splicing area for movement steps; and determining at least one of a selected image overlap width and a selected movement distance at which the brightness change values begin to keep constant as the first position error.

The method may include the following steps: generating a brightness function describing brightness values of the splicing area as a function of at least one of image overlap widths and movement distances; and obtaining differential values of the brightness function in relation to the at least one of image overlap widths and movement distances, wherein the at least one of the selected image overlap width and the selected movement distance corresponds to at least one of an image overlap width and a movement distance at which the differential values start to keep constant.

The method may include the following steps: controlling movement of the image-capturing device according to a predetermined overlap margin that affects an overlap amount between the first image and the second image; and removing a portion of at least one of the first image and the second image before performing the joining, wherein a width of the portion of at least one of the first image and the second image is a multiple of a width of the predetermined overlap margin in the first direction. The step of removing may be performed before determining the first position error and/or determining the second position error.

The capturing may be started with a corner portion of a chip on the wafer. The corner portion of the chip may be selected based on the layout data of the wafer.

An embodiment of this invention may be related to a system for obtaining calibration data for use in calibrating an optical proximity correction model. The system may include an image-capturing device configured to capture an image for each portion of a plurality of portions of wafer to obtain captured images, the captured images including a first image and a second image, the first image including an image of a first portion of the wafer, the second image including an image of a second portion of the wafer, the first portion of the wafer immediately neighboring the second portion of the wafer. The system may further include a processor configured to assemble at least portions of the captured images to form an assembled image, to map layout data of the wafer with the assembled image, to select portions of the assembled image based on the layout data of the wafer, and to obtain data associated with the portions of the assembled image as the calibration data.

The image-capturing device may be configured to move in at least a first direction for obtaining the captured images. A portion of the second image may include a partial image of the first portion of the wafer. A width of the portion of the second image in the first direction may be substantially equal to a predetermined overlap margin.

The image-capturing device may be configured to move linearly to obtaining images for portions of a first chip on the wafer, the portions of the first chip being arranged in an array. At least one of the processor and the image-capturing device may be configured to determine a second chip on the wafer. The image-capturing device may be configured to move linearly to obtaining images for portions of the second chip.

The image-capturing device may be configured to capture an image for a corner portion of the first chip located at a corner of the first chip. At least one of the processor and the image-capturing device may be configured to determine a first portion of the second chip. The first portion of the second chip may be located closer to the corner portion of the first chip than other portions of the second chip. The image-capturing device may be configured to capture an image for the first portion of the second chip before capturing images for the other portions of the second chip.

The image-capturing device may be configured to move in a first direction for obtaining the second image after having obtained the first image. The processor may be configured to determine a first position error and a second position error associated with relative positions of the first image and the second image, the first position error being in the first direction, the second position error being in a second direction, the second direction being perpendicular to the first direction. The processor may be further configured to join the image of the first portion of the wafer with the image of the second portion of the wafer using adjustments implemented based on the first position error and the second position error.

The processor may be configured to determine a first position associated with a centroid of the image of the first portion of the wafer in the second direction. The processor may be configured to determine a second position associated with a centroid of the second image of the second portion of the wafer in the second direction. The processor may be configured to determine a position difference value associated with a difference between the first position and the second position in the second direction. The processor may be configured to determine the second position error using the position difference value. The processor may be configured to determine the second position error using the difference value and a predetermined allowance The processor may be configured to determine a splicing area that has a predetermined width in the first direction and includes at least one of a portion of the first image and a portion of the second image. The processor may be configured to provide stepwise relative movement between the image of the first portion of the wafer and the image of the second portion of the wafer in a movement direction aligned with the first direction according to a predetermined step size to increase image overlap in a stepwise manner. The processor may be configured to measure brightness change values of the splicing area for movement steps. The processor may be configured to determine at least one of a selected image overlap width and a selected movement distance at which the brightness change values begin to keep constant as the first position error.

Movement of the image-capturing device may be controlled according to a predetermined overlap margin that affects an overlap amount between the first image and the second image. The processor may be configured to remove a portion of at least one of the first image and the second image before performing joining the image of the first portion of the wafer with the image of the second portion of the wafer. A width of the portion of at least one of the first image and the second image may be a multiple of a width of the predetermined overlap margin in the first direction.

An embodiment of this invention may be related to a technical solution for collecting calibration data for use in calibrating an optical proximity correction model.

An embodiment of this invention may be related to a method for collecting calibration data for use in calibrating an optical proximity correction model. The method may include the following steps: from an initial block, scanning all blocks on a wafer on the basis of each block to form each block's scan image; stitching the scan images of all blocks to form a stitched image; mapping layout data of the wafer onto the stitched image; and measuring images at predetermined positions of the stitched image to obtain calibration data.

An embodiment of the invention may be related to a system for collecting calibration data for use in calibrating an optical proximity correction model. The system may include a mechanical stage that may support a wafer and may be configured to manipulate the wafer and scan (and photographing) blocks on the wafer. The system may further include a processor coupled to the mechanical stage, configured to from an initial block, to scan all blocks on a wafer on the basis of each block to form each block's scan image, to stitch (or assemble) the scan images of all blocks to form a stitched image (or assembled image), to map layout data of the wafer onto the stitched image, and to measure images at predetermined positions of the stitched image to obtain calibration data.

The scan may be performed at a predetermined overlap margin in a scan direction to form the scan image of each block.

The scan may include the following steps: scanning substantially all blocks on a chip on the basis of each block along a horizontal or vertical direction; determining the next chip to be scanned; and executing the above steps repeatedly.

The scan may include the following steps: scanning all blocks on a chip on the basis of each block along a horizontal or vertical direction; when reaching the last block on the chip, determining an initial block on another chip closet to the last block; and executing the above steps repeatedly from the determined initial block on the other chip.

The step/task of stitching the scan images of all blocks to form a stitched image may include the following steps: determining a position error in a direction perpendicular to the scan direction for scan images of two adjacent blocks; determining a position error in the scan direction for the scan images of the two adjacent blocks; and based on the determined position errors, stitching the scan images of the two adjacent blocks together.

The step/task of determining a position error in a direction perpendicular to the scan direction for the scan images of the two adjacent blocks may include the following steps: calculating the centroids of the two adjacent blocks in the direction perpendicular to the scan direction; calculating the difference value between the calculated centroids; and determining the position error in the direction perpendicular to the scan direction based on the calculated difference value.

The step/task of determining the position error in the direction perpendicular to the scan direction based on the calculated difference value may include calculating the sum of the difference value and the predetermined allowance as the position error in the direction perpendicular to the scan direction.

The step/task of determining the position error in the scan direction for the scan images of the two adjacent blocks may include the following steps: splicing the scan images of the two adjacent blocks together; measuring the brightness value of the image in a splicing area while the scan images are overlapped at a predetermined step, wherein the splicing area has a predetermined size; and taking the overlap value at which the brightness value begins to keep constant as the position error in the scan direction.

The step/task of taking the overlap value at which the brightness value begins to keep constant as the position error in the scan direction may include the following steps: fitting a curve according to the brightness values and the overlap values; obtaining a differential curve of the curve; and determining a corresponding overlap value when the differential curve keeps constant as the position error in the scan direction.

The scan may be performed at a predetermined overlap margin in the scan direction to form scan image of each block; and wherein determining a position error in a direction perpendicular to the scan direction for scan images of two adjacent blocks further comprises: from a succeeding scan image of the scan images of the two adjacent blocks along the scan direction, removing a region having a width that is a multiple of the predetermined overlap margin on a side adjacent to the other scan image.

The initial block may be a block at a corner of a chip on the wafer, and the initial block may be determined based on the layout data of the wafer.

Embodiments of this invention may advantageously automate collection of calibration data for use in calibrating an optical proximity correction model.

DESCRIPTION OF THE EMBODIMENTS

Various embodiments of the present invention will be described in more detail with reference to the accompanying drawings. It should be noted that the relative arrangement of the components and steps, the numerical expressions, and numerical values set forth in these embodiments do not limit the scope of the present invention unless it is specifically stated otherwise. The following description is illustrative and does not limit the present invention or its application or utilization.

Similar reference numerals and letters may refer to similar items in the figures. If an item is described with reference to one figure, the item may not be further discussed with reference to other figures.

Although the terms "first", "second", etc. may be used herein to describe various elements, these elements, should not be limited by these terms. These terms may be used to distinguish one element from another element. Thus, a first element discussed below may be termed a second element without departing from the teachings of the present invention. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

Various embodiments, including methods and techniques, are described in this disclosure. It should be kept in mind that the invention might also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out operations pertaining to embodiments of the invention. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments of the invention.

Embodiments of the invention may be related to an automatic calibration data collection process that may not require substantial human intervenes. An embodiment of the invention may be related to a process that includes the following steps: scanning blocks of chips (which may include each block of each chip) on a wafer to obtain block images, assembling (or "stitching") the obtained block images to form a scan image of the wafer, mapping layout data of the wafer to the scan image, and inputting locations of the interested areas to locate a corresponding area in the scan image to obtain calibration data for an OPC model. The process may not need substantial human intervene and/or may not require locations of remarkable spots. Advantageously, accurate calibration data may be obtained with a repeatable process, and labor and cost may be saved.

Figure 2:
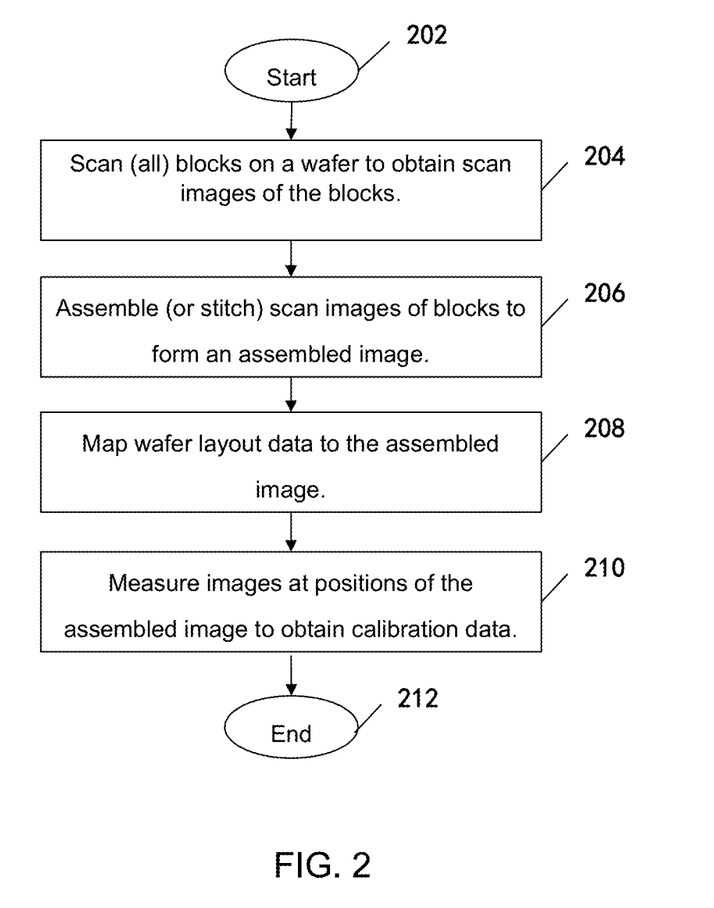
FIG. 2 is a flowchart illustrating a method for collecting and/or generating calibration data for use in calibrating an OPC model according to an embodiment of this invention.
Figure 6:
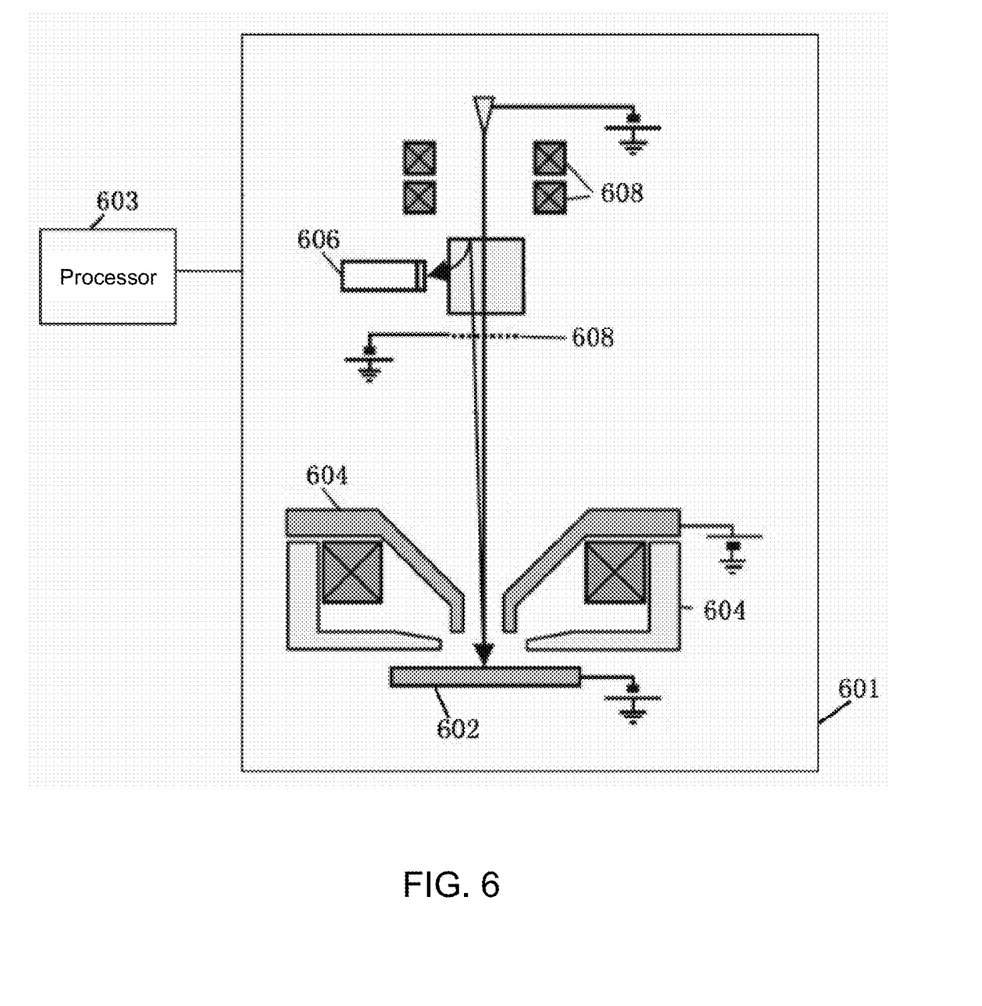
FIG. 6 shows a block diagram illustrating a system for collecting and/or generating calibration data for use in calibrating an OPC model according to an embodiment of this invention.

FIG. 2 shows a flowchart illustrating a method for collecting and/or generating calibration data t for use in calibrating an OPC model according to an embodiment of this invention. FIG. 6 shows a block diagram illustrating a system 600 (or device 600) for collecting calibration data for us in calibrating an OPC model according to an embodiment of this invention. The system 600 may include a mechanical stage 601 and a processor 603. The mechanical stage 601 may include a carrier 602 for supporting a wafer, a mechanical device 604 for driving the carrier, a detector 606 for detecting positions of chips on the wafer and positions of blocks of the chips, and a scanning electron microscope 608 for photographing images of elements (e.g., chips) of the wafer. The processor 603 may process the images to generate the calibration data. The method may be performed using the system 600 and may include the following steps 202, 204, 206, 208, 210, and 212.

At step 202, the calibration data collection and/or generation process begins.

At step 204, the scanning electron microscope 608 may scan substantially all blocks on a wafer to obtain scan images of the blocks.

The scan process may start from an initial block. The initial block may be determined based on layout data of the wafer. Those skilled in the art may appreciate that designers may have designed a layout for the wafer, which may involve a chip arrangement on the wafer, a space between the chips, the number of blocks in each chip, and a space between the blocks. The layout data is known before the calibration data collection and/or generation process is performed. Based on this layout data, locations of blocks on the wafer may be determined.

In an embodiment, the initial block is a block at a corner of a chip on the wafer. The advantages of this configuration may include simple and quick computation. For example, refer to FIG. 1, the initial block may be a block 104 at the upper left corner of a chip 102 on the wafer.

Figure 3:
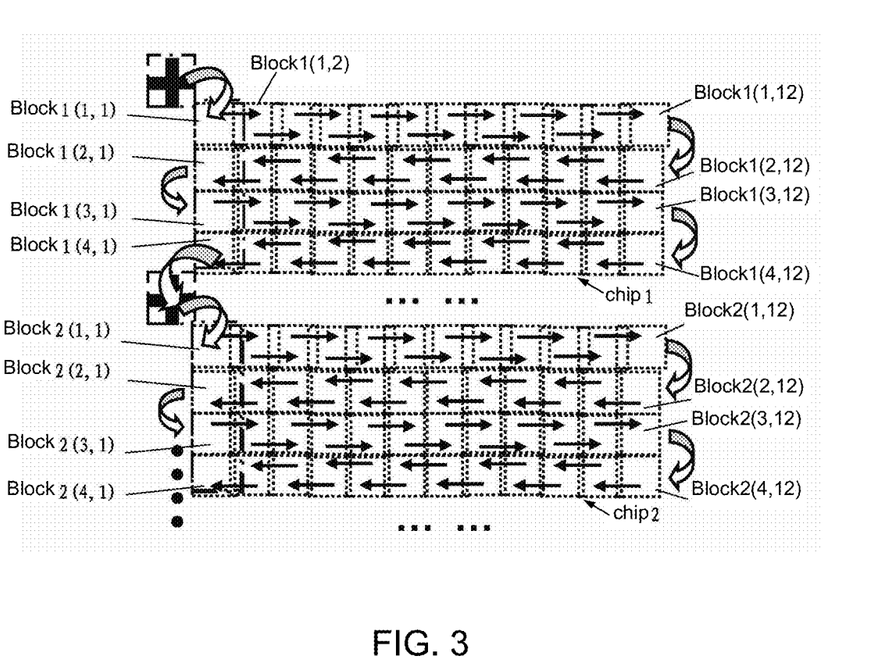
FIG. 3 shows a diagram illustrating a scan sequence of (all) blocks on a wafer.

FIG. 3 shows a diagram illustrating a scan sequence of (all) blocks on the wafer. As illustrated in FIG. 3, the scan may be performed along the horizontal or vertical direction.

According to an embodiment of this invention, from the initial block, along the horizontal (or vertical) direction, substantially all blocks on a chip are scanned one by one and row by row (or column by column). Upon reaching the last block of the chip, a block on another chip (preferably a block at a corner of the chip) closet to the last scanned block is determined to be the next initial block based on layout data of the wafer. The above scan and determination operations are repeatedly performed from the determined initial block on the subsequent chip.

As illustrated in FIG. 3, the initial block is block 1(1,1) may be first scanned, and subsequently block 1(1,2) to block 1(1, 12), block 1(2,12) to block 1(2,1), block 1(3,1) to block 1(3,12), and block 1(4,12) to block 1(4,1) are scanned one by one along the horizontal direction row by row. In an embodiment, according to the layout data of the wafer, it is determined that the next chip to be scanned is chip 2, and (analogous to the scan of chip 1) the following scan is performed: block 2(1,1) to block 2(1,12), block 2(2,12) to block 2(2,1), block 2(3,1) to block 2(3,12), and block 2(4,12) to block 2(4,1) are scanned one by one along the horizontal direction row by row.

According to an embodiment of this invention, from the initial block, along the horizontal (or vertical) direction, substantially all blocks on a chip are scanned one by one. Upon reaching the last block of the chip, a block on another chip closet to the last scanned block is determined to be the next initial block. The determination may be based on the layout data of the wafer. From the determined initial block, the above scan and determination operations are repeatedly performed on the other chips. This implementation may be automated and may reduce computation amount, so that time and cost can be saved.

Referring to FIG. 3 again, when block 1(4,1) is reached in the scan, block 2(1,1) on chip 2 is determined as the next closest block, and the above process is repeatedly performed on chip 2 from block 2(1,1).

For a chip on the wafer, its size may be about 3.8 mm×4.0 mm. An integrated block on the chip may have a size of about 5 μm×6 μm. According to an embodiment of this invention, scan may be performed based on the size of the blocks. In other words, an image is photographed every 5 μm (along the horizontal direction) or 6 μm (along the vertical direction).

As those skilled in the art may appreciate, due to precision limits of the mechanical stage 601, distance error may present in movement of the lens of the scanning electron microscope 608. For example, when scanning along the horizontal direction, the lens should ideally move 5 μm each time, but may actually move a distance in a range of 5 μm−50 nm to 5 μm+50 nm instead. If the actual movement distance is 5 μm−50 nm, the obtained images may overlap with each other.

If the actual movement distance is 5 μm+50 nm, the obtained images may be incomplete and thus unacceptable.

In order to obtain complete images, according to an embodiment of this invention, scan is performed in a scan direction at a predetermined overlap margin. The predetermined overlap margin may be determined empirically. In an embodiment, the overlap margin may be in a range from 10 nm to 100 nm. In an embodiment, the overlap margin may be in a range from 20 nm to 50 nm.

In an embodiment, an image is taken every 5 mm–50 nm of specified lens movement when scanning is performed along the horizontal direction or taken every 6 mm-50 nm of specified lens movement when scanning is performed along the vertical direction.

At step 206, the processor 603 may assemble (or "stitch") scan images of scanned blocks to a form an assembled image (or "stitched" image).

According to an embodiment of this invention, substantially no scan overlap margin is implemented, and scan images may be assembled into a complete image of the wafer according to the scan sequence. The images may be assembled using one or more existing tools.

According to an embodiment of this invention, a scan overlap margin is implemented, in which case, the processor 603 may assemble the block images after removing overlap errors along the scan direction and/or a direction perpendicular to the scan direction. Referring to FIG. 3 again, as an example, block 1(1,1) and block 1(1,2) may have an overlapped area. The processor 603 may remove a possible overlap error associated with the overlapped area when joining images of block 1(1,1) and block 1(1,2).

According to an embodiment of this invention, in order to remove the overlap error, a position error of scan images of two adjacent blocks in a direction perpendicular to the scan direction may be determined, and/or a position error of the scan images of the two adjacent blocks in the scan direction may be determined Based on the determined position error(s), the two adjacent blocks are joined (or stitched) together.

Because of the use of the predetermined overlap margin, the position error in the scan direction may be determined as the predetermined overlap margin, and the position error in a direction perpendicular to the scan direction may be determined as 0 or a predetermined value (for example, an empirically determined value). The predetermined value may depend on inherent features of the mechanical stage 601. It may be estimated by those skilled in the art according to their practical applications and experiences. In an embodiment, the predetermined value is 3 nm.

Affected by positioning precision of the mechanical stage, the position errors may be different from that described above. In an embodiment, in microcosm, flash used in photographing the images may affect the shot object. For example, the flash may thin traces or outlines. In an embodiment, position errors associated with the flash may be corrected.

According to an embodiment of this invention, a method for determining a position error of scan images of two adjacent blocks in a direction perpendicular to the scan direction may comprise the following steps: calculating centroids of the scan images of the two adjacent blocks in the direction perpendicular to the scan direction; calculating the difference value between the calculated centroids; and determining the position error in the direction perpendicular to the scan direction based on the calculated difference value. The method is further discussed with reference to FIG. 4A, FIG. 4B, and FIG. 4C.

According to an embodiment of this invention, a method for determining the position error in the scan direction for the scan images of the two adjacent blocks may comprise the following steps: joining (or splicing) the scan images of the two adjacent blocks together to produce a joined image, wherein the scan images overlap to a predetermined extent; measuring the brightness value of the joined image in the splicing area, wherein the splicing areas has a predetermined size; and using an overlap value at which the brightness value becomes constant as the position error in the scan direction. The method is further discussed with reference to FIG. 5A and FIG. 5B.

In the following description with reference to FIGS. 4A to 5B, the scan direction is the horizontal direction, and the direction perpendicular to the scan direction is the vertical direction.

Figure 4A:
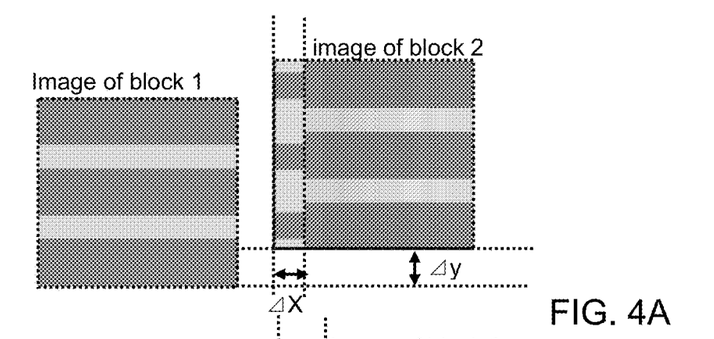
FIG. 4A, FIG. 4B, and FIG. 4C are diagrams illustrating a process of determining (and correcting) a position error in a vertical direction according to an embodiment of this invention.
Figure 4B:
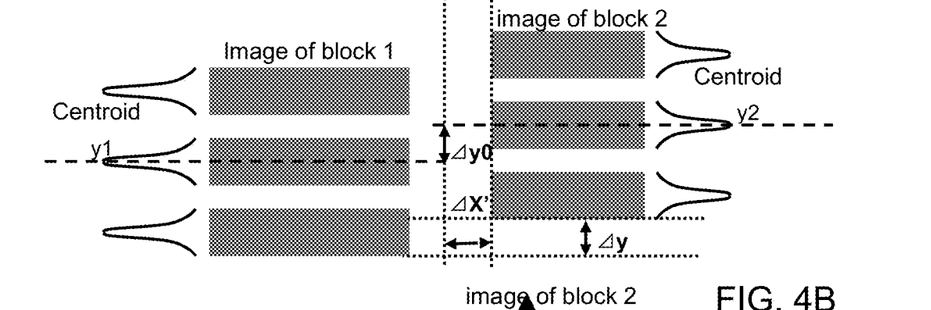
Figure 4C:
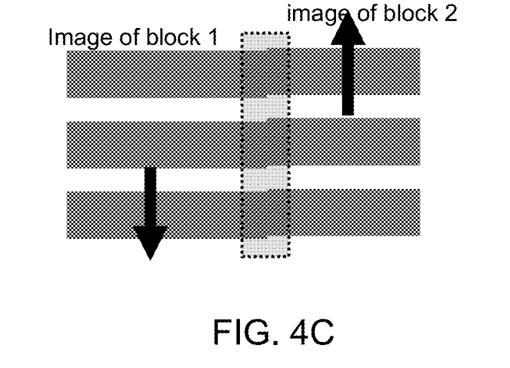

FIG. 4A, FIG. 4B, and FIG. 4C are diagrams illustrating a process of determining (and correcting) a position error in the vertical direction according to the embodiment of this invention.

Referring to FIG. 4A, the three trace sections (represented by three blocks) in the image of block 1 should be aligned with the three trace sections in the image of block 2 in the horizontal direction in ideal conditions. In practice, because of errors inherent to the mechanical stage 601, the three trace sections in the image of block may not be perfectly aligned with the three trace sections in the image of block 2, and an error $\Delta y$ may exist in the vertical direction and may represent an offset (or displacement) between the images of blocks 1 and 2.

According to an embodiment of this invention, centroids of images in the vertical direction are used to determine the position error. For example, referring to FIG. 4B, the centroid position y1 of (the central trace section of) the scan image of block 1 is calculated, the centroid position y2 of (the central trace section of) the scan image of block 2 is calculated, and a position error $\Delta y0$ is equal to the absolute value of the difference between y1 and y2.

An existing technical means may be applied in centroid calculation.

Because of image overlap (e.g., given the use of an overlap margin), as illustrated in the image of block 2 in FIG. 4A, images of the traces may be distorted, e.g., thinned on the left side of the image, for having been shot twice. In order to obtain a more accurate error value, the distorted portion of the image of block 2 may be removed. For example, a portion having a width of $\Delta x'$ (for example, a predetermined overlap margin) in the horizontal direction may be removed from the left side of the image of block 2. In an embodiment, in order to further improve accuracy, a portion having a width of a multiple of the predetermined overlap margin in the horizontal direction may be removed.

In an embodiment, the predetermined overlap margin is 20 nm. For the image of block 2 in FIG. 4A, a portion having a width of $\Delta X=20$ nm (and positioned between the image of block 1 and the portion of the image of block 2 to be retained) may be removed (or cut off) from the left side of the image of block 2. For a more accurate result, a portion having a width of $\Delta X'=40$ nm or 60 nm may be removed (or cut off) from the left side of the image of block 2. Subsequently, the centroid of the image of block 2 may be calculated.

For a further accurate result, an adjusted position error may be calculated using the position error $\Delta y0+/-$ a predetermined value. In an embodiment, referring to FIG. 4C, the position error calculated based on the centroid is $\Delta y0=20$ nm, and the adjusted (or final) position error in the vertical direction is determined as Δy=20 nm+/−3 nm, i.e., a value in a range of 17 nm to 23 nm.

Figure 5A:
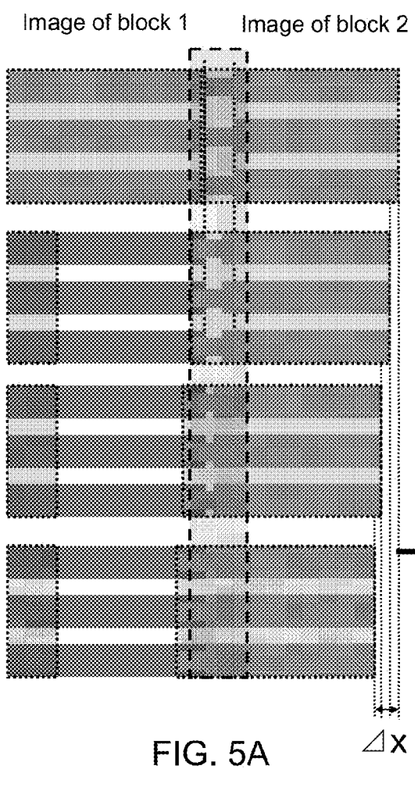
FIG. 5A and FIG. 5B are diagrams illustrating a process of determining (and correcting) a position error in a horizontal direction according to an embodiment of this invention.
Figure 5B:
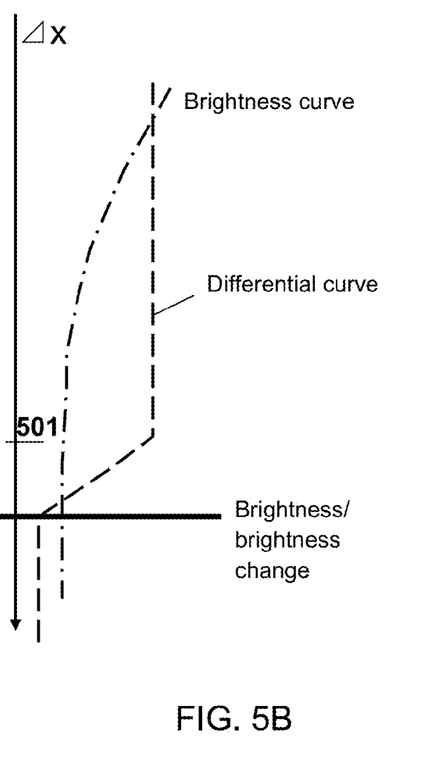

FIG. 5A and FIG. 5B are diagrams illustrating a process of determining (and correcting) a position error in the horizontal direction according to the embodiment of this invention.

The actual position error in the horizontal direction may larger than or smaller than the predetermined overlap margin. In order to determine the actual position error in the horizontal direction, in an embodiment, variation in brightness is used to determine the actual position error.

In a scan image, distortion may occur on a region because of multiple times of photographing, and thus may cause changes in brightness of the image. For example, traces may be thinned due to multiple times of flash light irradiation, so that brightness of corresponding portion of the image of block 2 may be lowered.

Referring to FIG. 5A, first, the scan images of block 1 and block 2 are jointed together without substantial overlap. A splicing area may be defined. The splicing area may have a width that may be equal to a multiple of the predetermined overlap margin, a user-defined value, and/or an empirical value. The splicing area width may be determined according to user requirements.

Subsequently, the processor 603 may gradually overlap portions of the two images of blocks 1 and 2 step by step at a predetermined step, for example, by moving the image of block 2 toward the image of block 1 stepwise. For each step, the brightness value of the image in the splicing area is obtained. The predetermined step may be set to a fraction of the predetermined overlap margin (e.g., 5% of the predetermined overlap margin), a user-defined value, and/or an empirical value. The predetermined step may be determined according to user requirements. The predetermined step may sufficiently enable identification of changes in brightness in the splicing area.

Because of the distortion present in (the left portion of) the image of block 2, the brightness in its initial overlapped area is lower than the brightness in the other area that is not overlapped. As more of the image of block 2 overlaps the image of block 1 gradually, the brightness in the splicing area increases gradually, as illustrated in FIG. 5A.

When the brightness in the splicing area becomes constant, i.e., when further overlap does not further change the brightness, a corresponding block overlap amount Δx at this time is determined as the position error in the horizontal direction.

According to an embodiment of this invention, the predetermined step may be set to a very small value, for example, 1/1000 of the predetermined overlap margin. For each step, a brightness value of the block image in the splicing area is obtained. Upon the brightness of the block image in the splicing area does not change further, a curve is fixed using obtained brightness values and overlap values, as illustrated by the brightness curve in FIG. 5B. The vertical axis of the brightness curve represents the overlap amount Δx, and the horizontal axis represents brightness values. Then the brightness curve is differentiated to obtain the differential curve illustrated in FIG. 5B. The vertical axis of the differential curve represents the overlap amount Δx, and the horizontal axis represents the change rate of brightness values (i.e., differential values). The overlap amount at point 501 where the differential curve becomes a vertical line, i.e., where the differential value does not change further, is determined as the position error in the horizontal direction.

After the position errors in the horizontal direction and the vertical direction are determined, when the processor 603 assembles (or stitch) block images, block images are adjusted in the horizontal and vertical directions based on the position errors in the horizontal and vertical directions, and then block images are spliced with each other. As a result, a complete assembled (or stitched) image of the wafer is formed.

At step 208, layout data of the wafer is mapped to the stitched image.

The assembled (or stitched) image may be imagined as (or analogous to) a real aerial photograph of a city, in which various streets, buildings, and other establishments are shown distinctly. Layout data of the wafer may be imagined as (or analogous to) a blueprint (or plan drawing) of the city, in which latitudes and longitudes of the various streets, buildings, and other establishments are specified. The mapping is to associate the latitudes and longitudes with corresponding streets, buildings, and other establishments.

The mapping may be implemented using one or more known techniques.

At step 210, based on the layout data (e.g., coordinate or position data), data related to images at predetermined positions (e.g., images of particular structures at particular positions) on the assembled (or stitched) image are obtained (e.g., measured) to obtain calibration data.

In OPC model correction, operators generally want to obtain calibration data (e.g., an image of the real structure) in an interested area on the wafer obtained based on the OPC model. Because the layout data of the wafer has been associated with the assembled (or stitched) image of the wafer, based on the position data of the interested area, the image of the position may be obtained from the assembled (or stitched) image.

At step 212, the calibration data collection and/or generation process may be completed.

FIG. 6 shows a block diagram illustrating a system 600 for collecting calibration data used for use in calibrating an OPC model according to an embodiment of this invention. The system 600 comprises a mechanical stage 601 and a processor 603. A wafer may be arranged in the mechanical stage 601, and the mechanical stage 601 is configured to move the wafer and to scan blocks on the wafer. As illustrated in the figure, the mechanical stage 601 comprises a carrier 602 for carrying the wafer, a mechanical device 604 for driving the carrier, and a detector 606 and a scanning electron microscope 608 for photographing the wafer. The detector 606 may detect the positions of chips and their blocks in the wafer for controlling the scanning electron microscope 608 to take photos of located blocks.

The processor 603 is coupled to the mechanical stage 601 to obtain various data and photographed images from the mechanical stage 601. The processor 603 is configured to perform the following tasks: starting from an initial block, controlling the mechanical stage 601 to scan (all) blocks on a wafer to obtain each scan images of the blocks, assembling (or stitching) the scan images of the blocks to form an assembled (or stitched) image, mapping layout data of the wafer onto the assembled (or stitched) image, and controlling the mechanical stage 601 to measure images at predetermined positions of the assembled (stitched) image to obtain calibration data.

According to an embodiment of this invention, the mechanical stage 601 is configured to perform the scan at a predetermined overlap margin in a scan direction to form the scan image of each block.

According to an embodiment of this invention, the mechanical stage 601 (controlled by the processor 603) is configured to perform the following tasks: along the horizontal or vertical direction, scanning all blocks one by one on a chip; when reaching the last block of the chip, determining a block on another chip closet to the last block to be an initial block on the other chip; and executing the above operations repeatedly from the determined initial block on the other chip.

According to an embodiment of this invention, the processor 603 is configured to perform the following tasks: determining a position error in a direction perpendicular to the scan direction for scan images of two adjacent blocks; determining a position error in the scan direction for the scan images of the two adjacent blocks; based on the determined position errors, assembling (or joining or stitching) the scan images of the two adjacent blocks together.

According to an embodiment of this invention, the processor 603 is configured to perform the following tasks: calculating the coordinates of the centroids of the scan images of the two adjacent blocks in the direction perpendicular to the scan direction; calculating the difference value between the calculated coordinates of the centroids; and determining the position error in the direction perpendicular to the scan direction based on the calculated difference value.

According to an embodiment of this invention, the processor 603 is configured to calculate the sum of the difference value and a predetermined allowance as an adjusted position error in the direction perpendicular to the scan direction.

According to an embodiment of this invention, the processor 603 is configured to perform the following tasks: splicing scan images of two adjacent blocks; determining a splicing area having a predetermined size; increasing overlap of the images of the two adjacent blocks stepwise by providing a stepwise relative movement between the images according to a predetermined step size; measuring a brightness value of an image in the splicing area at each step; take an overlap value (or relative movement value) at which the brightness value begins to keep constant as the position error in the scan direction.

According to an embodiment of this invention, the processor 603 is configured to perform the following tasks: fitting a curve according to the brightness values and the overlap values; obtaining a differential curve of the curve; and determining a corresponding overlap value where the differential curve indicates a constant differential value as the position error in the scan direction.

According to an embodiment of this invention, the mechanical stage 601 is configured to perform the scan process at a predetermined overlap margin in the scan direction to form scan images of various block, and the processor 603 is configured to from a joined scan image of the two scan images of the two adjacent blocks along the scan direction after removing a region of one of the two scan images, the region having a width that is a multiple of the predetermined overlap margin on a side adjacent to the other scan image.

Features and advantages of the processor 603 and the mechanical stage 601 can be appreciated from the description provided with reference to FIG. 2-FIG. 5.

According to embodiments of this invention, generated (and/or collected) calibration data may enable mapping between the OPC model layout data of a wafer and a complete scan image of the wafer overlap. Any part of the scan image can be located using the layout data of the wafer. For performing tests, no repeated scan may be required for new wafers. Embodiments of this invention may automate calibration data collection. Advantageously, data reusability may be realized, repeatability in calibration data collection may be eliminated, and/or time and cost required for OPC model calibration and/or wafer testing may be minimized.

A method and/or a system according an embodiment of the present invention may be implemented in many ways. For example, a method and/or a system according to an embodiment of the present invention may be implemented using one or more of software, hardware, and firmware. The above described order of the steps for the method is intended to be illustrative, and the steps of the method of the present invention are not limited to the above specifically described order unless otherwise specifically stated. Some embodiments of the present invention may be implemented as programs recorded (or stored) in a non-transitory tangible medium and/or may include machine-readable instructions for implementing a method according to an embodiment of the present invention. Embodiments of the present invention may cover the medium.

Although some specific embodiments of the present invention have been described in detail, it should be understood by a person skilled in the art that the described embodiments are intended to be illustrative but not to limit the scope of the present invention. It should be understood by a person skilled in the art that the above embodiments can be modified without departing from the scope and spirit of the present invention. The scope of the present invention is defined by the attached claims.

What is claimed is:

1. A method for obtaining calibration data for use in calibrating an optical proximity correction model, the method comprising:
    capturing, using an image-capturing device, an image for each portion of a plurality of portions of a wafer to obtain captured images, the captured images including a first image and a second image, the first image including an image of a first portion of the wafer, the second image including an image of a second portion of the wafer, the first portion of the wafer immediately neighboring the second portion of the wafer;
    assembling, using a processor that is connected to the image-capturing device, at least portions of the captured images to form an assembled image;
    mapping layout data of the wafer with the assembled image;
    selecting portions of the assembled image based on the layout data of the wafer; and
    obtaining data associated with the portions of the assembled image as the calibration data.

2. The method according to claim 1, further comprising: controlling an image-capturing device to move in at least a first direction for obtaining the captured images,
    wherein a portion of the second image includes a partial image of the first portion of the wafer, and
    wherein a width of the portion of the second image in the first direction is substantially equal to a predetermined overlap margin.

3. The method according to claim 1, further comprising: controlling an image-capturing device to move linearly to obtaining images for portions of a first chip on the wafer, the portions of the first chip being arranged in an array;
    determining a second chip on the wafer; and
    controlling the image-capturing device to move linearly to obtaining images for portions of the second chip.

4. The method according to claim 3, further comprising:
    capturing an image for a corner portion of the first chip located at a corner of the first chip;
    determining a first portion of the second chip, the first portion of the second chip being located closer to the corner portion of the first chip than other portions of the second chip; and
    capturing an image for the first portion of the second chip before capturing images for the other portions of the second chip.

5. The method according to claim 1, further comprising: after obtaining the first image, controlling an image-capturing device to move in a first direction for obtaining the second image, wherein the assembling comprises:
- determining a first position error and a second position error associated with relative positions of the first image and the second image, the first position error being in the first direction, the second position error being in a second direction, the second direction being perpendicular to the first direction; and
- using adjustments implemented based on the first position error and the second position error, joining the image of the first portion of the wafer with the image of the second portion of the wafer.

6. The method according to claim 5, wherein the determining the second position error comprises:
- determining a first position associated with a centroid of the image of the first portion of the wafer in the second direction;
- determining a second position associated with a centroid of the second image of the second portion of the wafer in the second direction;
- determining a position difference value associated with a difference between the first position and the second position in the second direction; and
- determining the second position error using the position difference value.

7. The method according to claim 6, wherein the second position error is determined using the position difference value and a predetermined allowance.

8. The method according to claim 5, wherein determining the first position error comprises:
- determining a splicing area that has a predetermined width in the first direction and includes at least one of a portion of the first image and a portion of the second image;
- providing stepwise relative movement between the image of the first portion of the wafer and the image of the second portion of the wafer in a movement direction aligned with the first direction according to a predetermined step size to increase image overlap in a stepwise manner;
- measuring brightness change values of the splicing area for movement steps; and
- determining at least one of a selected image overlap width and a selected movement distance at which the brightness change values begin to keep constant as the first position error.

9. The method according to claim 8, further comprising:
- generating a brightness function describing brightness values of the splicing area as a function of at least one of image overlap widths and movement distances; and
- obtaining differential values of the brightness function in relation to the at least one of image overlap widths and movement distances, wherein the at least one of the selected image overlap width and the selected movement distance corresponds to at least one of an image overlap width and a movement distance at which the differential values start to keep constant.

10. The method according to claim 5, further comprising:
- controlling movement of the image-capturing device according to a predetermined overlap margin that affects an overlap amount between the first image and the second image; and
- removing a portion of at least one of the first image and the second image before performing the joining, wherein a width of the portion of at least one of the first image and the second image is a multiple of a width of the predetermined overlap margin in the first direction.

11. The method according to claim 1, wherein the capturing is started with a corner portion of a chip on the wafer, and wherein the corner portion of the chip is selected based on the layout data of the wafer.

12. A system for obtaining calibration data for use in calibrating an optical proximity correction model, the system comprising:
- an image-capturing device configured to capture an image for each portion of a plurality of portions of wafer to obtain captured images, the captured images including a first image and a second image, the first image including an image of a first portion of the wafer, the second image including an image of a second portion of the wafer, the first portion of the wafer immediately neighboring the second portion of the wafer; and
- a processor configured to assemble at least portions of the captured images to form an assembled image, to map layout data of the wafer with the assembled image, to select portions of the assembled image based on the layout data of the wafer, and to obtain data associated with the portions of the assembled image as the calibration data.

13. The system according to claim 12,
- wherein the image-capturing device is configured to move in at least a first direction for obtaining the captured images,
- wherein a portion of the second image includes a partial image of the first portion of the wafer, and
- wherein a width of the portion of the second image in the first direction is substantially equal to a predetermined overlap margin.

14. The system according to claim 12,
- wherein the image-capturing device is configured to move linearly to obtaining images for portions of a first chip on the wafer, the portions of the first chip being arranged in an array,
- wherein at least one of the processor and the image-capturing device is configured to determine a second chip on the wafer, and
- wherein the image-capturing device is configured to move linearly to obtaining images for portions of the second chip.

15. The system according to claim 14,
- wherein the image-capturing device is configured to capture an image for a corner portion of the first chip located at a corner of the first chip,
- wherein at least one of the processor and the image-capturing device is configured to determine a first portion of the second chip, the first portion of the second chip being located closer to the corner portion of the first chip than other portions of the second chip, and
- wherein the image-capturing device is configured to capture an image for the first portion of the second chip before capturing images for the other portions of the second chip.

16. The system according to claim 12,
- wherein the image-capturing device is configured to move in a first direction for obtaining the second image after having obtained the first image,
- wherein the processor is configured to determine a first position error and a second position error associated with relative positions of the first image and the second image, the first position error being in the first direction, the second position error being in a second direction, the second direction being perpendicular to the first direction, and wherein the processor is further configured to join the image of the first portion of the wafer with the image of the second portion of the wafer using adjustments implemented based on the first position error and the second position error.

17. The system according to claim 16, wherein the processor is configured to determine a first position associated with a centroid of the image of the first portion of the wafer in the second direction, wherein the processor is configured to determine a second position associated with a centroid of the second image of the second portion of the wafer in the second direction, wherein the processor is configured to determine a position difference value associated with a difference between the first position and the second position in the second direction, and wherein the processor is configured to determine the second position error using the position difference value.

18. The system according to claim 17, wherein the processor is configured to determine the second position error using the difference value and a predetermined allowance.

19. The system according to claim 16, wherein the processor is configured to determine a splicing area that has a predetermined width in the first direction and includes at least one of a portion of the first image and a portion of the second image, wherein the processor is configured to provide stepwise relative movement between the image of the first portion of the wafer and the image of the second portion of the wafer in a movement direction aligned with the first direction according to a predetermined step size to increase image overlap in a stepwise manner, wherein the processor is configured to measure brightness change values of the splicing area for movement steps, and wherein the processor is configured to determine at least one of a selected image overlap width and a selected movement distance at which the brightness change values begin to keep constant as the first position error.

20. The system according to claim 16, wherein movement of the image-capturing device is controlled according to a predetermined overlap margin that affects an overlap amount between the first image and the second image, wherein the processor is configured to remove a portion of at least one of the first image and the second image before performing joining the image of the first portion of the wafer with the image of the second portion of the wafer, and wherein a width of the portion of at least one of the first image and the second image is a multiple of a width of the predetermined overlap margin in the first direction.

* * * * *